(12) United States Patent
Chen et al.

(10) Patent No.: US 7,981,743 B2
(45) Date of Patent: Jul. 19, 2011

(54) METHOD OF FABRICATING A MEMORY CELL

(75) Inventors: Mao-Quan Chen, Changhua County (TW); Ching-Nan Hsiao, Kaohsiung County (TW); Chung-Lin Huang, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 636 days.

(21) Appl. No.: 12/039,744

(22) Filed: Feb. 29, 2008

(65) Prior Publication Data

US 2009/0087544 A1 Apr. 2, 2009

(30) Foreign Application Priority Data

Oct. 2, 2007 (TW) ................................ 96136920 A

(51) Int. Cl.
*H01L 21/336* (2006.01)
*H01L 21/302* (2006.01)
*H01L 21/461* (2006.01)

(52) U.S. Cl. ........................................ 438/257; 438/757
(58) Field of Classification Search .................. 438/257, 438/757; 257/E29.3
See application file for complete search history.

(56) References Cited

U.S. PATENT DOCUMENTS

| 5,923,063 | A | * | 7/1999 | Liu et al. | 257/316 |
| 6,174,753 | B1 | * | 1/2001 | Liao | 438/132 |
| 6,392,267 | B1 | * | 5/2002 | Shrivastava et al. | 257/316 |
| 2001/0034106 | A1 | * | 10/2001 | Moise et al. | 438/396 |
| 2006/0113547 | A1 | * | 6/2006 | Shin | 257/77 |

* cited by examiner

*Primary Examiner* — William M. Brewster
(74) *Attorney, Agent, or Firm* — Winston Hsu; Scott Margo

(57) ABSTRACT

The memory cell of the present invention has two independent storage regions embedded into two opposite sidewalls of the control gate respectively. In this way, the data storage can be more reliable. Other features of the present invention are that the thickness of the dielectric layers is different, and the two independent storage regions are formed on opposite bottom sides of the opening by the etching process and form a shape like a spacer. The advantage of the aforementioned method is that the fabricating process is simplified and the difficulty of self-alignment is reduced.

7 Claims, 16 Drawing Sheets

METHOD OF FABRICATING A MEMORY CELL

BACKGROUND OF THE INVENTION

1. Field of the Invention

The present invention relates to a method for manufacturing memories, and more particularly, to a method for manufacturing two-bit memory cells.

2. Description of the Prior Art

Flash memory is a non-volatile memory. It can maintain stored information even without a power supply. Generally speaking, flash memory can be divided into two types of configurations, namely, a NOR flash memory and a NAND flash memory. The NOR flash memory is suitable for code flash memory mainly used for executing program codes. The NAND flash memory is suitable for a data flash memory mainly used for data storage.

FIG. 1 shows a structure of a two-bit flash memory cell according to the prior art. As shown in FIG. 1, the structure of the conventional two-bit flash memory cell comprises: a substrate 10, a gate insulating layer 12 comprising a silicon oxide layer 18, a silicon nitride layer 16, and a silicon oxide layer 14, wherein the silicon nitride layer 16 has two charge storage regions 16a, 16b and a control gate 20 is positioned on the gate insulating layer 12.

The two charge storage regions 16a, 16b of the above-mentioned flash memory cell are capable of storing two-bit data. However, as the size of electronic devices shrinks, the distance between the storage regions 16a, 16b becomes shorter which will result in complementary bit disturbance and other data storage problems.

SUMMARY OF THE INVENTION

Therefore, a method of fabricating memory cells which can solve the above-mentioned problem, increase integrity of the elements, simplify the manufacturing process and lower the cost is provided.

According to a preferred embodiment of the present invention, a method of fabricating a memory cell comprises forming a doping region in a substrate; providing a patterned first dielectric layer on the substrate to expose a substrate surface; forming a second dielectric layer on top of the substrate surface; forming two insulating materials at junctions between the second dielectric layer and the patterned first dielectric layer; conformally forming a third dielectric layer to cover the patterned first dielectric layer, the second dielectric layer and the two insulating materials; and forming a conductive material on top of the third dielectric layer.

According to another preferred embodiment of the present invention, a method of fabricating a memory cell, comprises: providing a substrate with a first dielectric layer and a second dielectric layer sequentially formed on top of the substrate; patterning the second dielectric layer, the first dielectric layer and the substrate to form a first opening; forming an oxide layer on a bottom of the first opening; forming two insulating materials on bottom corners of the first opening; conformally forming a third dielectric layer on the substrate to cover the second dielectric layer, the oxide layer and the two insulating materials; forming a conductive gate in the first opening; removing the second dielectric layer to form a second opening; forming a doping region in the substrate disposed at the bottom of the second opening; and filling up the second opening with a fourth dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
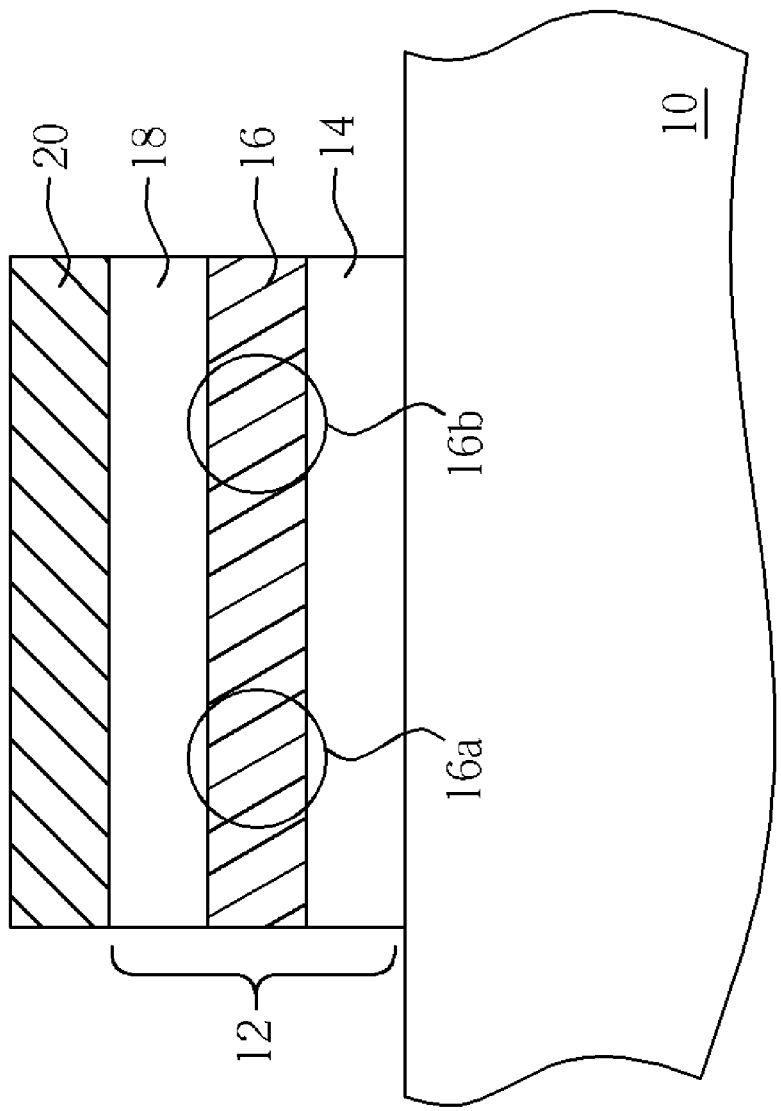
FIG. 1 shows a structure of a two-bit flash memory cell according to the prior art.
Figure 2:
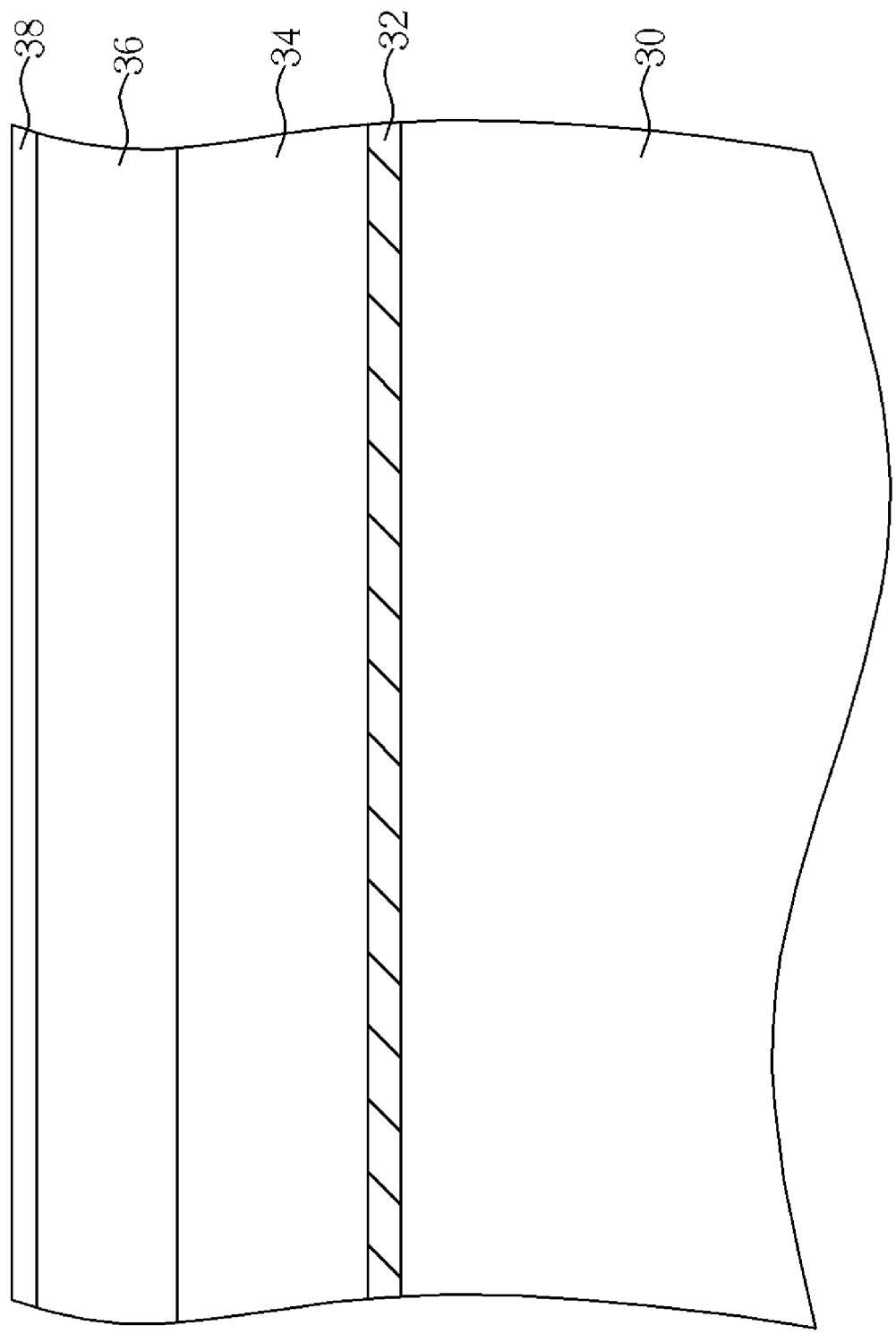
FIGS. 2 to 9 are schematic diagrams illustrating a method of fabricating a memory cell according to a first preferred embodiment of the present invention.

FIGS. 2 to 9 are schematic diagrams illustrating a method of fabricating a memory cell according to a first preferred embodiment of the present invention. As shown in FIG. 2, a substrate 30 comprising a silicon oxide layer 32, a silicon nitride layer 34, a mask layer 36 and a silicon-oxy-nitride layer 38 positioned in sequence is provided. The silicon-oxy-nitride layer 38 is taken as an anti-reflection layer. The mask layer 36 comprises carbon.

Figure 3:
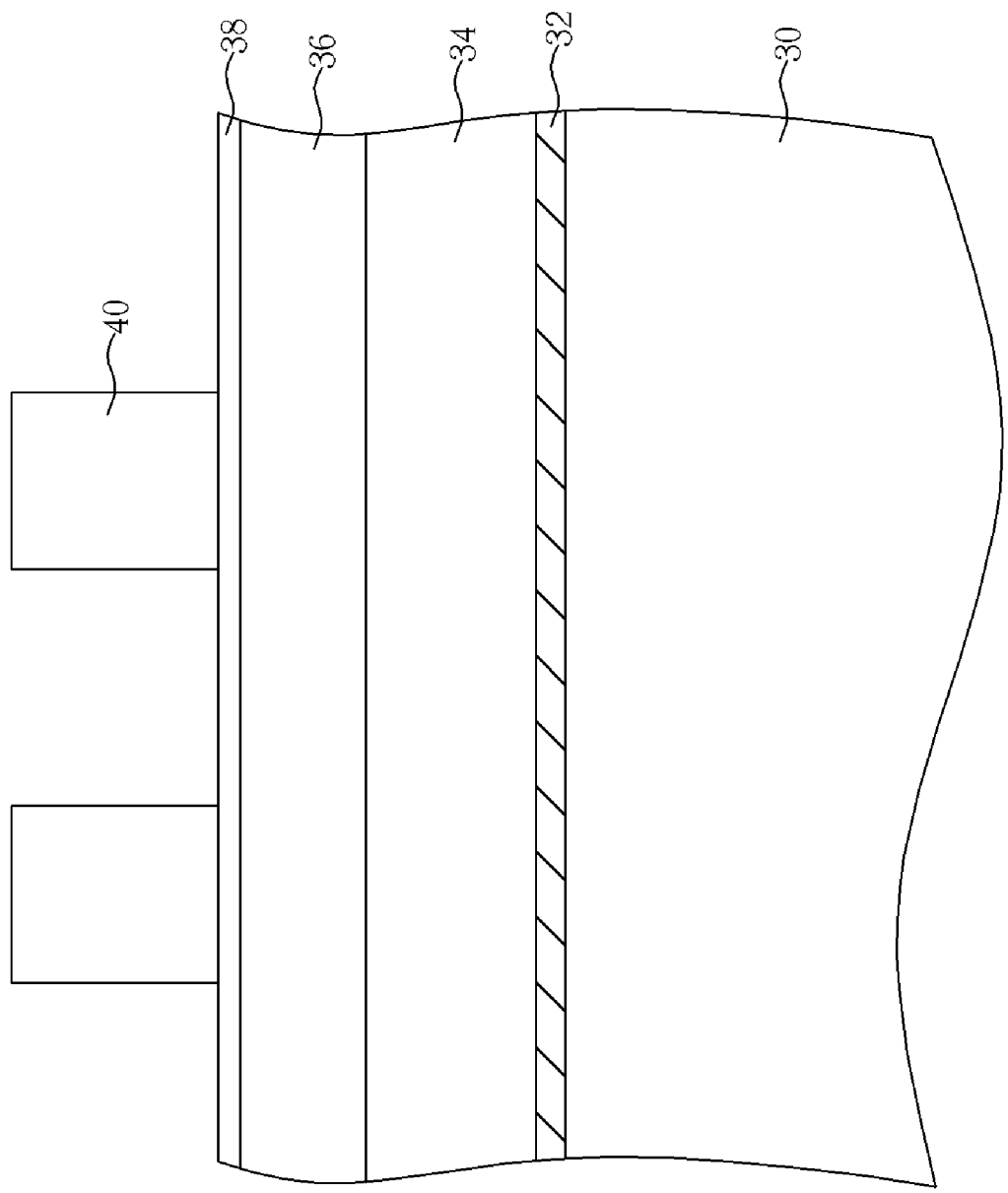
Figure 4:
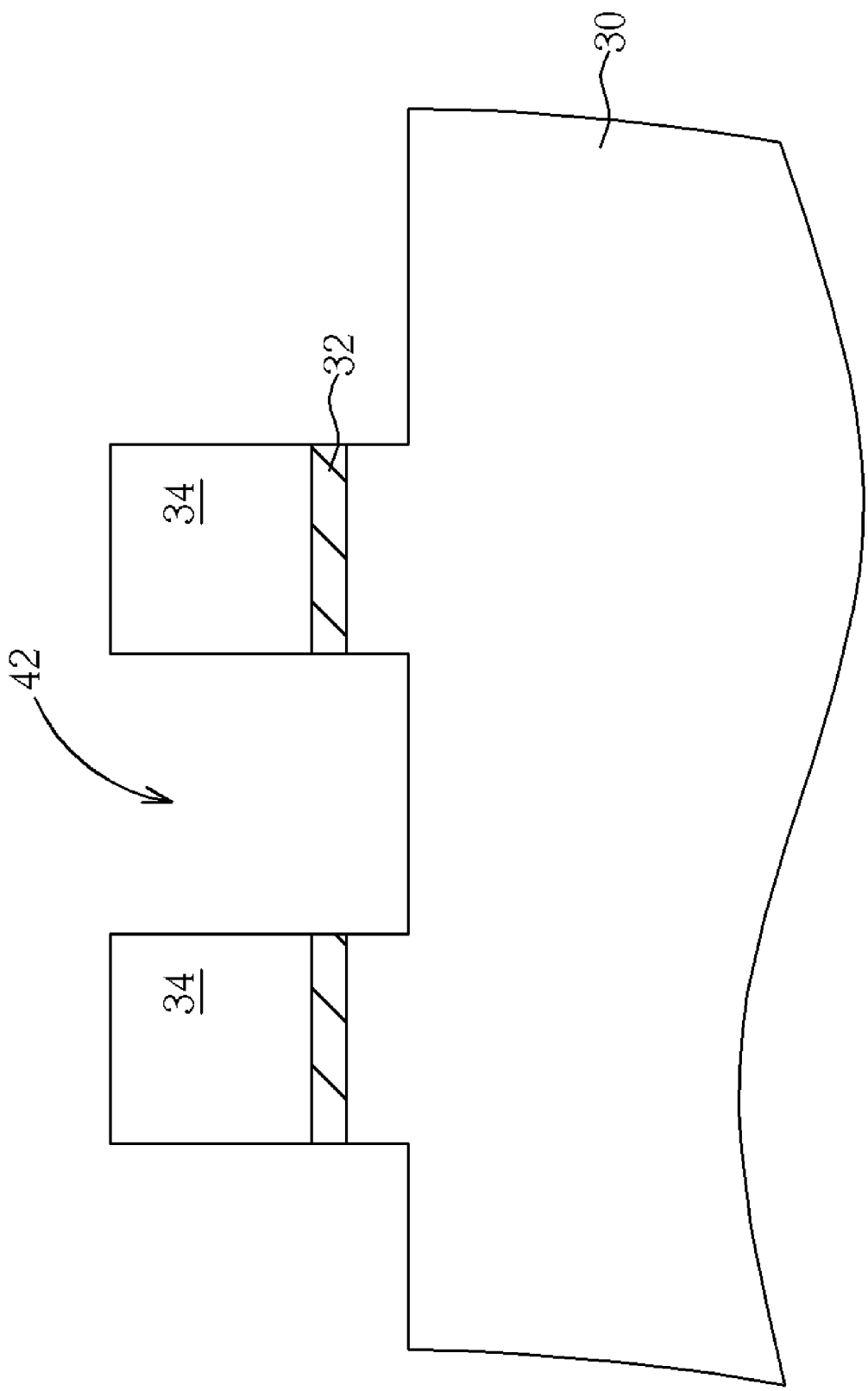

As shown in FIG. 3, a patterned photoresist layer 40 is formed on the silicon-oxy-nitride layer 38. Then, as shown in FIG. 4, a portion of the silicon-oxy-nitride layer 38 that is not covered by the photoresist layer 40 and a portion of the mask layer 36 that is not covered by the photoresist layer 40 are removed by etching. The pattern on the photoresist is then transferred to the mask layer 36, and then the photoresist layer 40 is removed. After that, the silicon nitride layer 34, the silicon oxide layer 32 and the substrate 30 are etched by taking the mask layer 36 as a mask to form a first opening 42. Then, the mask layer 36 and the silicon-oxy-nitride layer 38 are totally removed.

Figure 5:
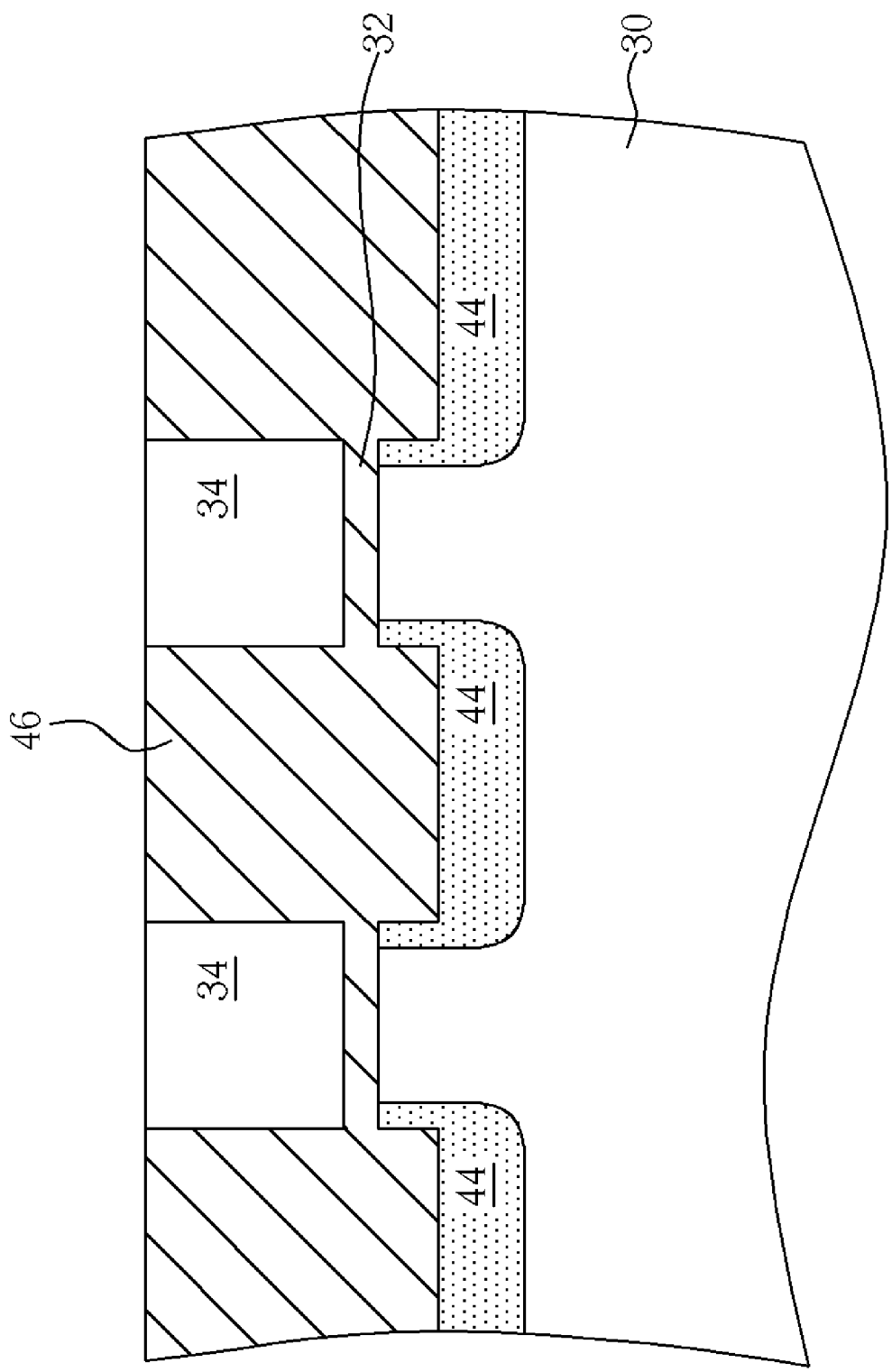

As shown in FIG. 5, a source/drain buried doping region 44 is formed in the substrate 30 at the bottom of the first opening 42, wherein the method of forming the source/drain buried doping region 44 can be a gas phase doping process or an ion implantation process. After that, a rapid thermal anneal process is performed to repair the lattice damage and activate the dopants in the source/drain buried doping region 44. Then, the first opening 42 is filled up with a dielectric layer 46 such as silicon oxide and the surface of the dielectric layer 46 is aligned with the surface of the silicon nitride layer 34. The dielectric layer 46 can be formed by a high density plasma chemical vapor deposition (HDP CVD) process and a chemical mechanical polishing (CMP) process.

Figure 6:
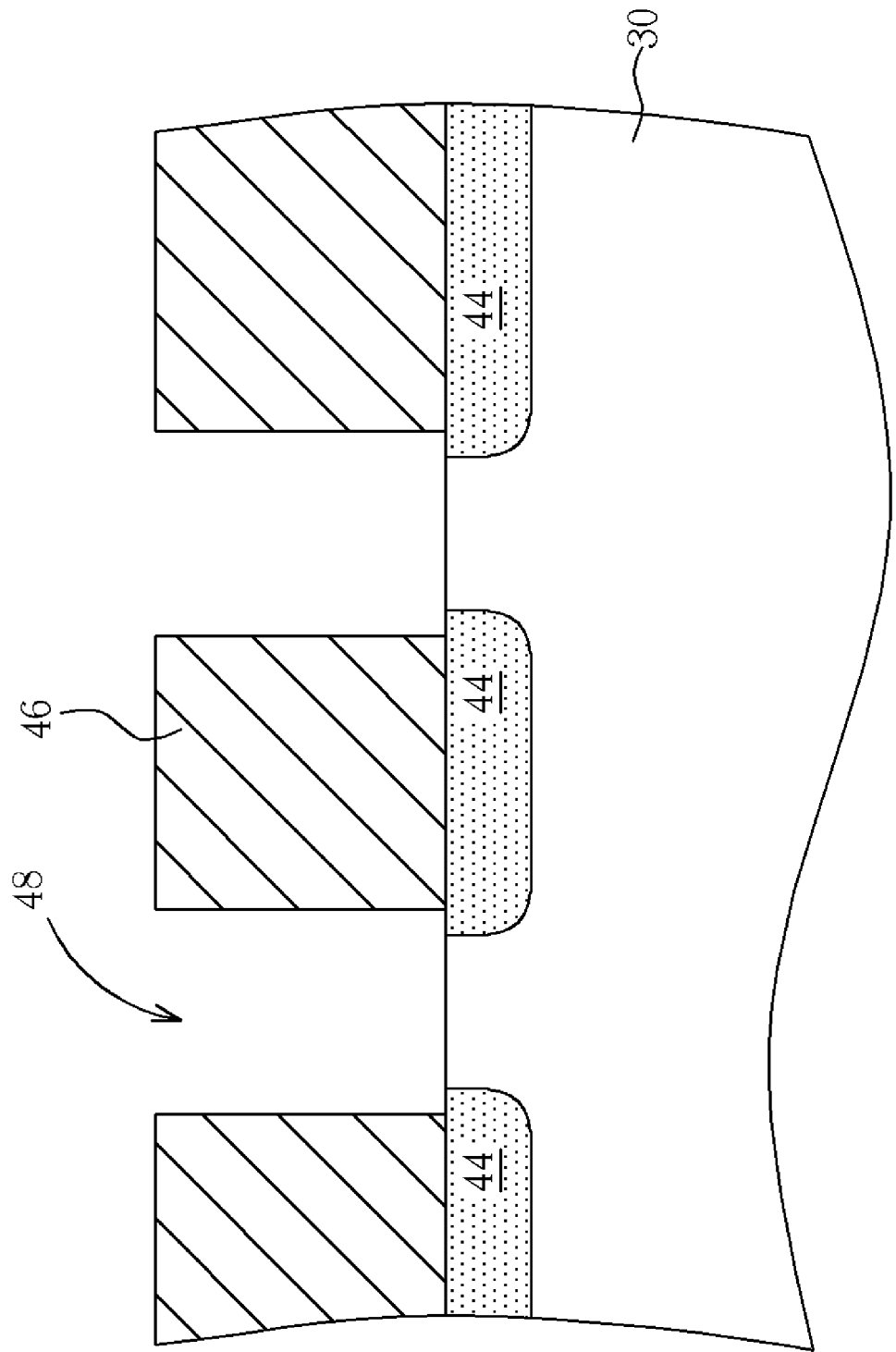

As shown in FIG. 6, the silicon nitride layer 34 and the silicon oxide layer 32 are removed to expose the substrate 30. Then, the exposed substrate 30 is etched to make the surface of the substrate 30 approximately aligned with the bottom of the dielectric layer 46 to form a second opening 48. Now the substrate 30 is exposed through the dielectric layer 46.

Figure 7:
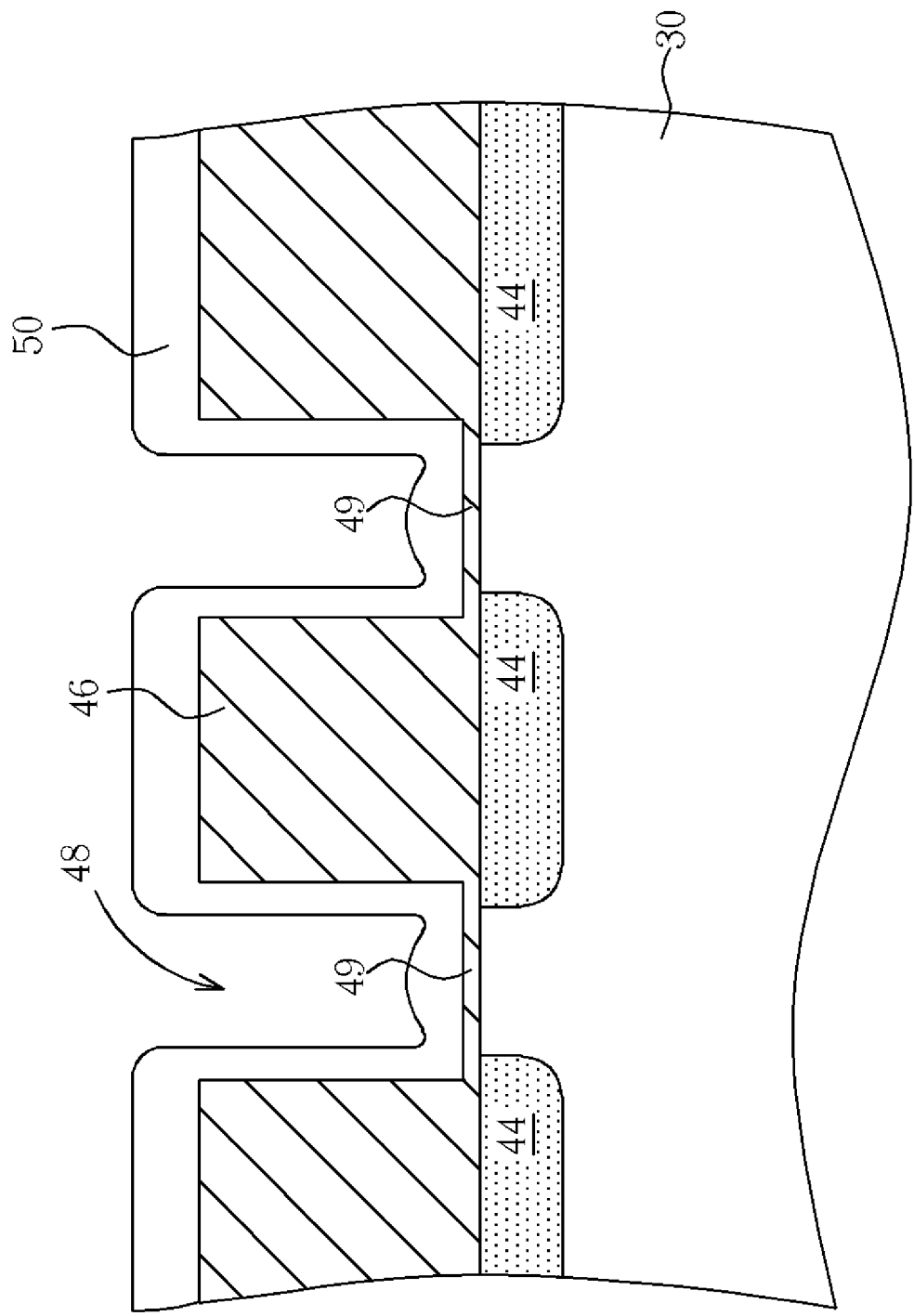

As shown in FIG. 7, a dielectric layer 49 is formed on the on top of the exposed surface of substrate 30. After that, an insulating layer 50 is conformally disposed on the surface of the dielectric layer 46 and the second opening 48. The surface of the dielectric layer 46 and the dielectric layer 49 are then covered by the insulating layer 50. The dielectric layer 49 can be formed by silicon oxide and the insulating layer 50 can be formed by silicon nitride.

Figure 8:
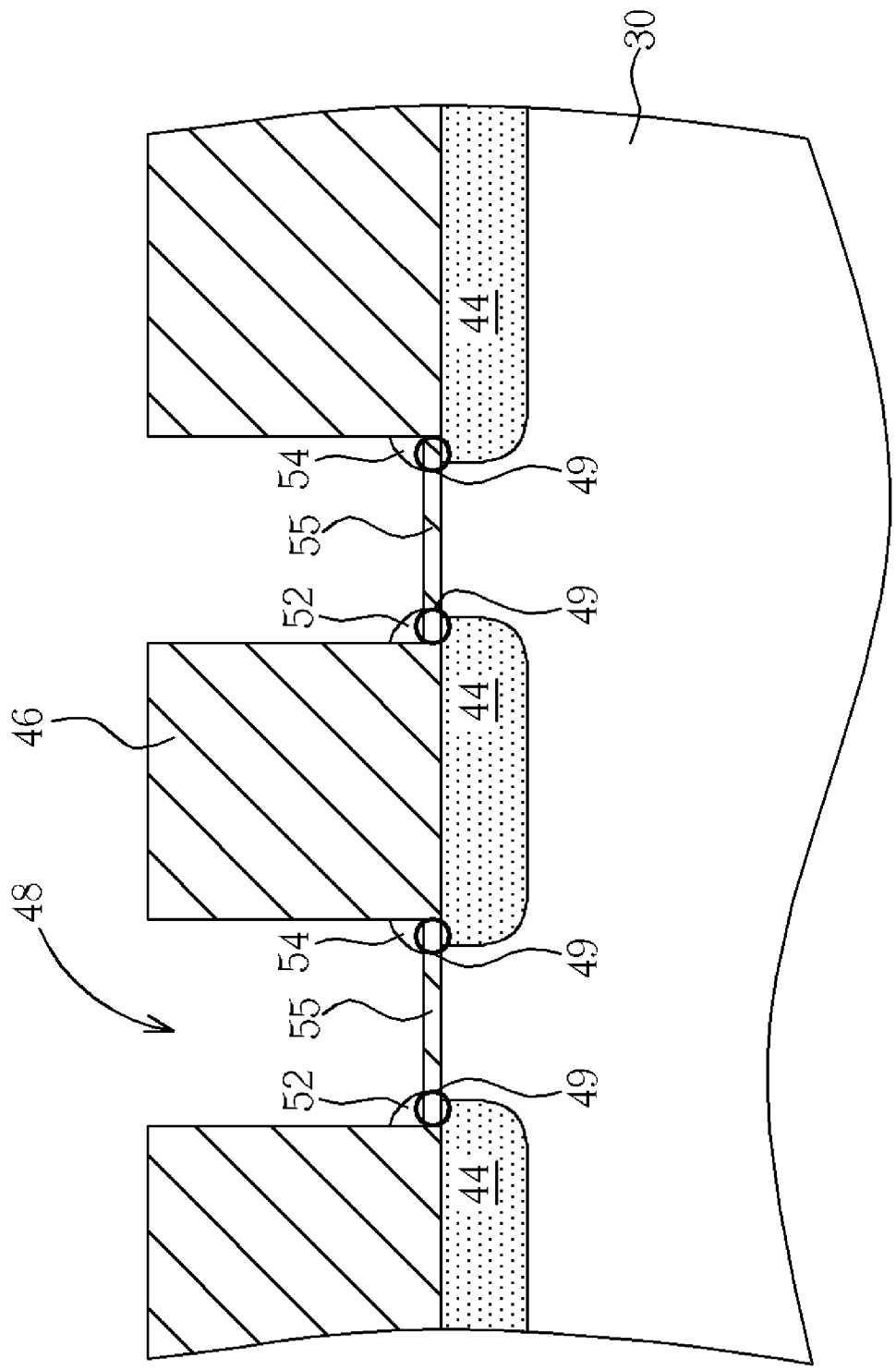

As shown in FIG. 8, the insulating layer 50 is etched partially to form insulating materials 52, 54 at junctions between the dielectric layer 49 and the dielectric layer 46. The insulating materials 52, 54 serve as independent charge storage regions and the insulating materials 52, 54 do not connect with each other. It should be noted that the thickness of the insulating layer 50 disposed at the portion of the dielectric layer 49 which is on the bottom of the second opening 48 is thicker than the thickness of the insulating layer 50 disposed on the sidewall of the second opening 48. Therefore, the insulating materials 52, 54 can be formed through an etching process by using the difference in thickness. Furthermore, insulating materials 52, 54 are disconnected to each other. According to a preferred embodiment, the surface of the insulating materials 52, 54 are spherical, but they are not limited to this shape. In addition, the difficulty in self-alignment can be decreased by using the method of forming the insulating materials 52, 54 mentioned above. Furthermore, when the insulating layer 50 is etched to form the insulating materials 52, 54, a portion of the dielectric layer 49, which is not covered, by the insulating layer 50 is etched as well. The portion of the dielectric layer 49 that is etched becomes thinner, therefore, the thinner dielectric layer 49 cannot make the substrate 30 isolated to the control gate which will be formed afterwards.

Therefore, a dielectric layer 55 is formed on the portion of the dielectric layer 49 that is not covered by the insulating materials 52, 54. The dielectric layer 55 can be formed by a rapid thermal oxidation process. In addition, the portion of the dielectric layer 49 that is covered by the insulating materials 52, 54 serves as a tunnel oxide layer. The portion of the dielectric layer 49 which is covered by the dielectric layer 55, and the dielectric layer 55 serve as a control gate oxide layer.

Figure 9:
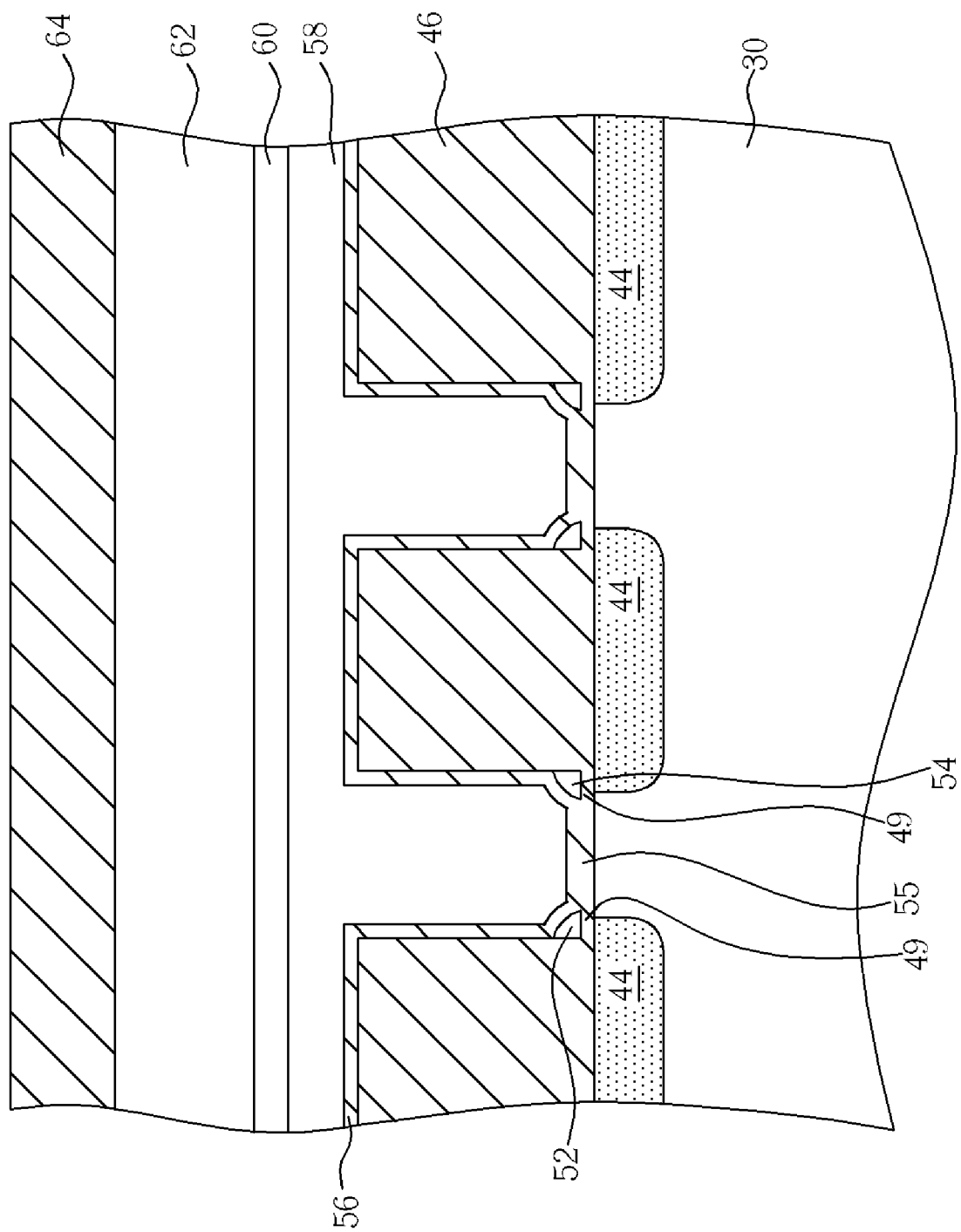

As shown in FIG. 9, a dielectric layer 56 such as silicon oxide is formed on the surface of the insulating materials 52, 54 the surface of the dielectric layer 55 and the surface of the dielectric layer 46. The dielectric layer 56 can be a high temperature oxide (HTO). The tunnel oxide layer, the insulating materials 52, 54 and the dielectric layer 56 combine to form an oxide-nitride-oxide (ONO) composite layer. Then, the second opening 48 is filled up with a conductive material 58 such as polysilicon. The conductive material 58 serves as a control gate. At this point, the memory cell is finished. Furthermore, the dielectric layer 46 can be optionally covered by the conductive material 58 according to different requirements. Then, a salicide layer 60 can be formed on the conductive material 58. After that, a silicon nitride layer 62 can be formed on the salicide layer 60, and a silicon oxide layer 64 can be formed on the silicon nitride layer 62.

FIGS. 10 to 16 are schematic diagrams illustrating the method of fabricating a memory cell according to the second preferred embodiment of the present invention.

Figure 10:
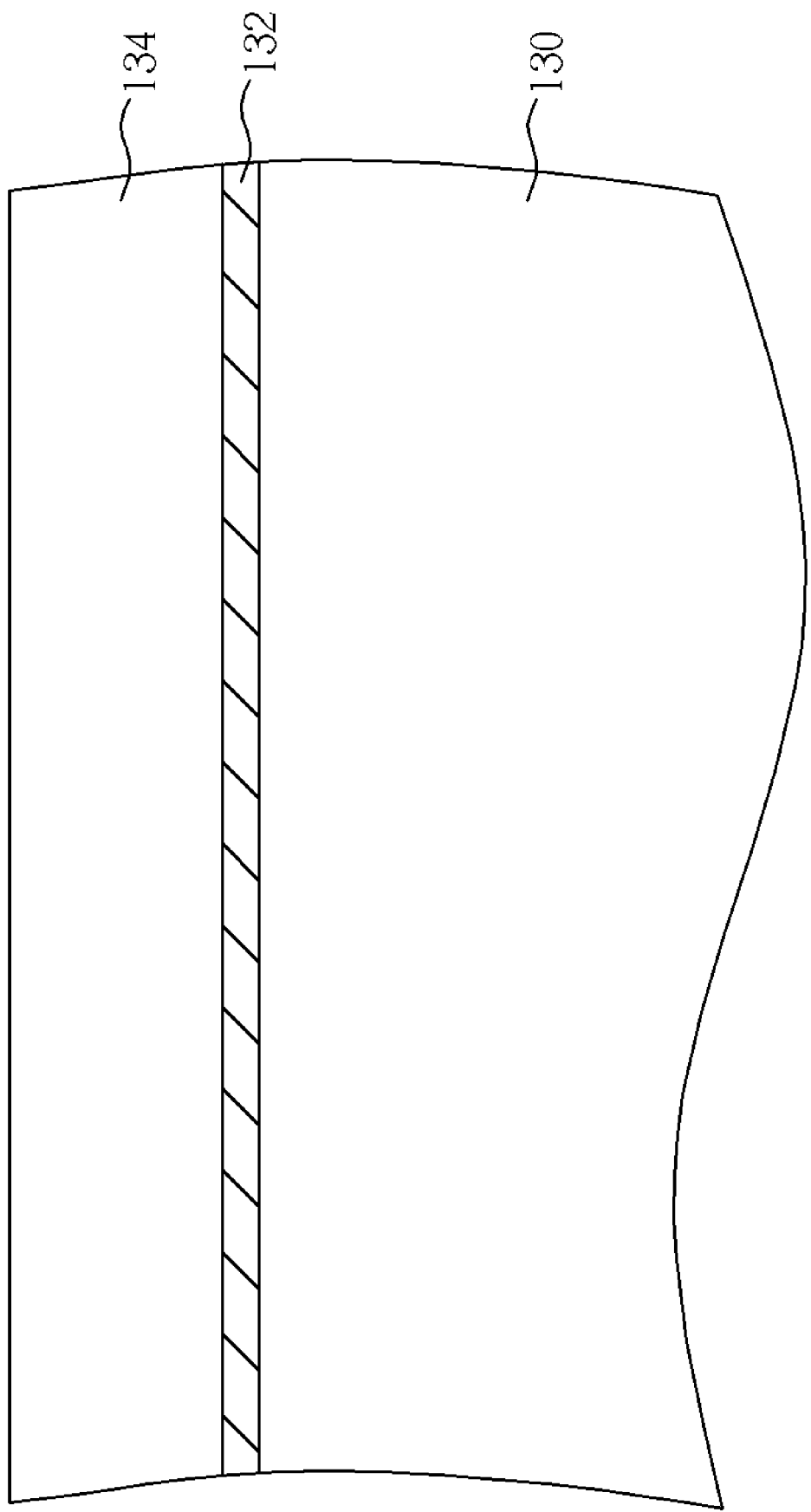
FIGS. 10 to 16 are schematic diagrams illustrating a method of fabricating a memory cell according to a second preferred embodiment of the present invention.

As shown in FIG. 10, a substrate 130 comprising a silicon oxide layer 132 and a silicon nitride layer 134 is provided.

Figure 11:
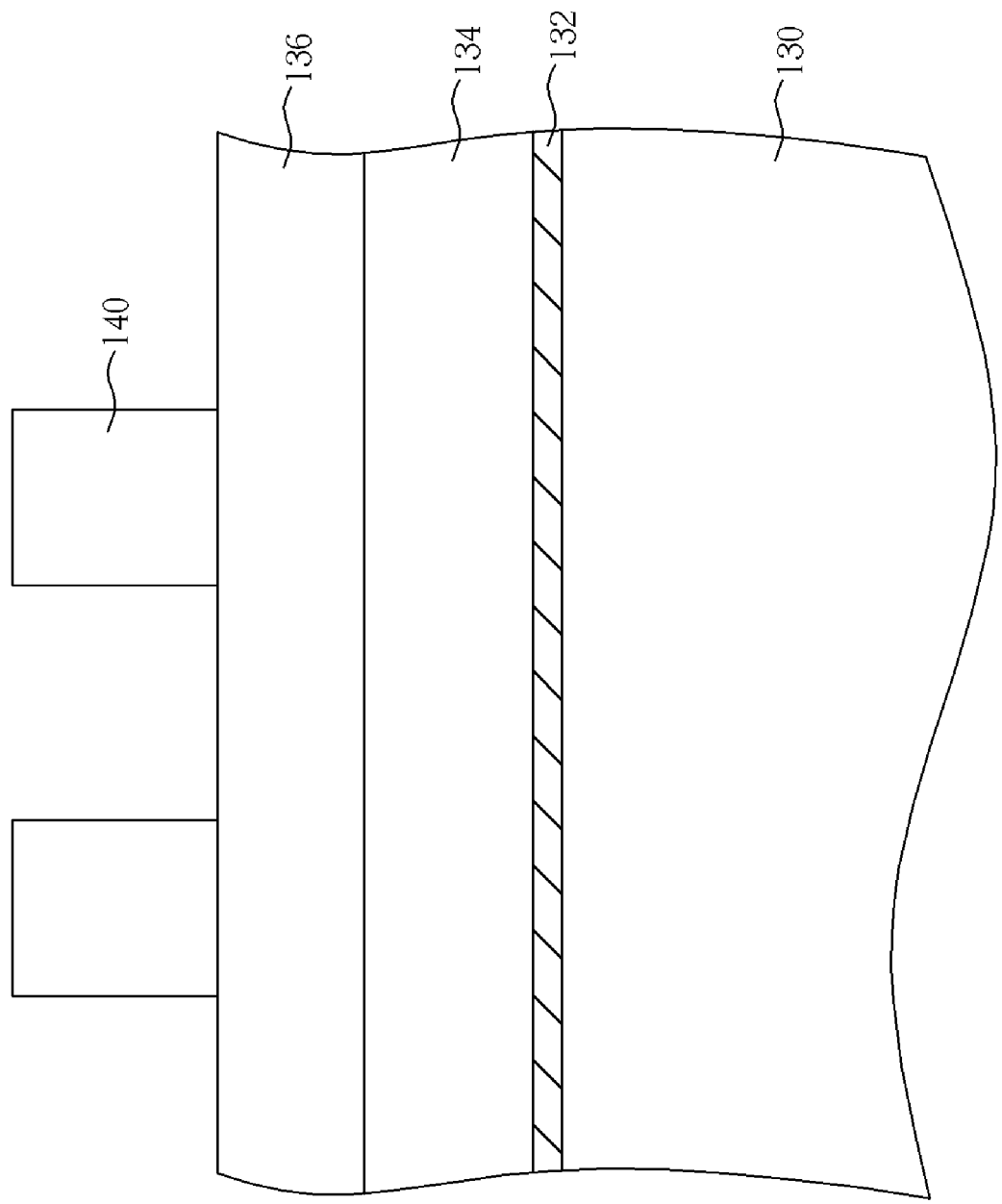

As shown in FIG. 11, a mask layer 136 is formed on the surface of the silicon nitride layer 134. The mask layer 136 comprises carbon. Next, a patterned photoresist layer 140 is formed to partly cover the mask layer 136.

Figure 12:
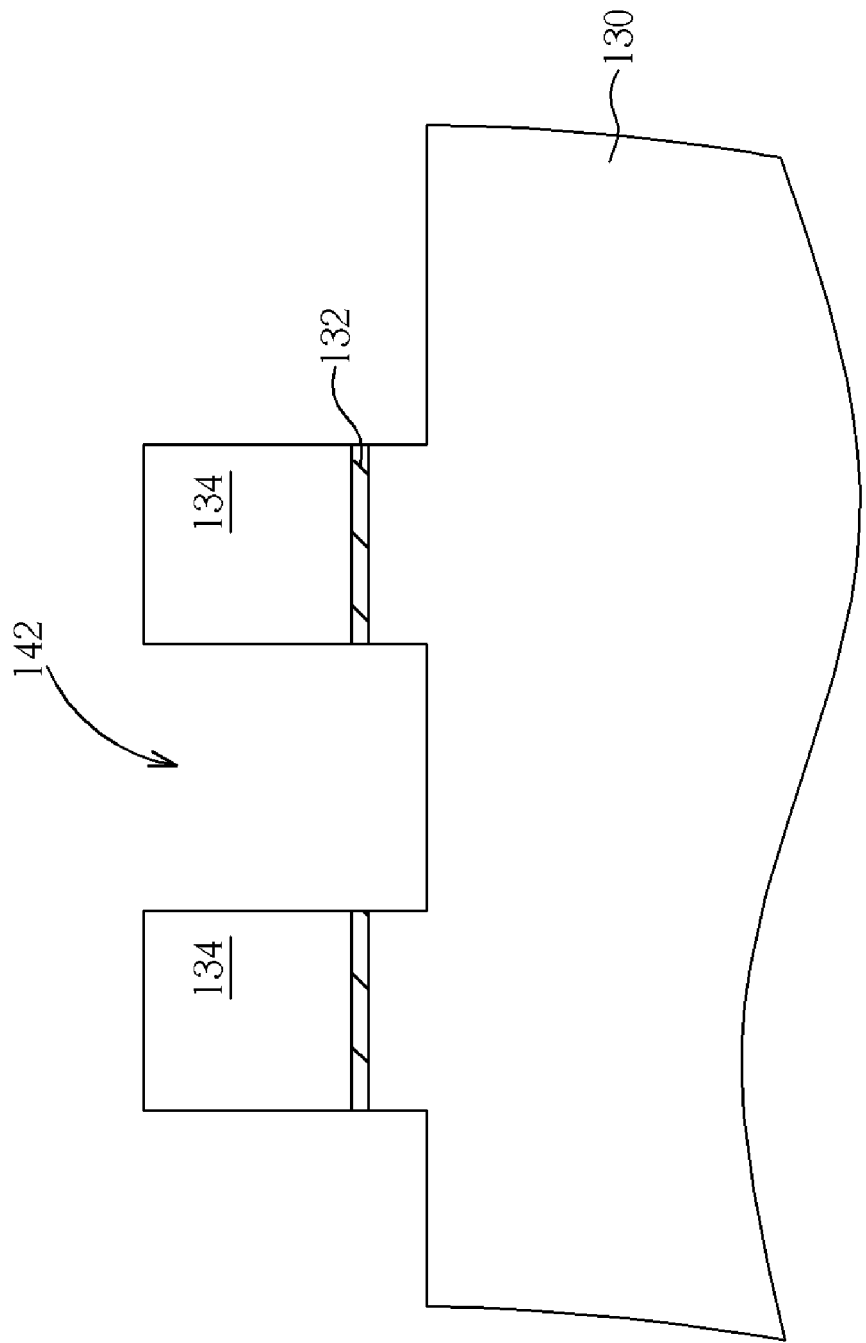

As shown in FIG. 12, the mask layer 136 is etched. Then, the silicon nitride layer 134 is etched. After that, the photoresist layer 140 is removed. Next, the silicon oxide layer 132 is etched to expose the substrate 130 by taking the mask layer 136 as a mask, The substrate 130 is then etched continuously until the surface of the substrate 130 is lower than the bottom of the silicon oxide layer 132. Afterwards, the mask layer 136 is removed, and a first opening 142 is formed.

Figure 13:
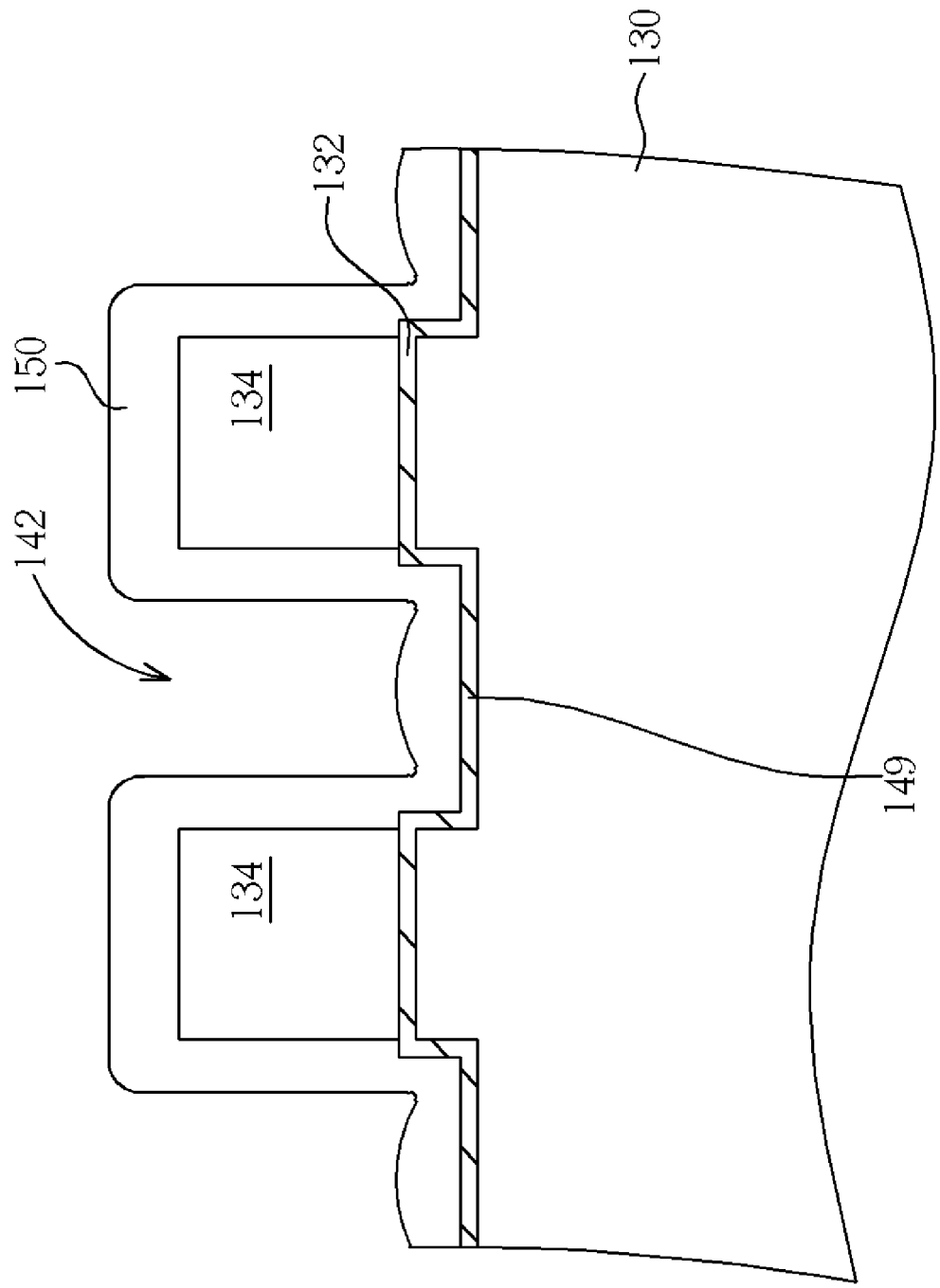

As shown in FIG. 13, an oxide layer 149 is formed on the bottom of the first opening 142. The method for forming the oxide layer 149 includes a thermal oxidation process. After that, a insulating layer 150 is conformally disposed on the surface of the silicon nitride layer 134 and surface of the first opening 142, so the silicon nitride layer 134 and the oxide layer 149 are covered by the insulating layer 150. The insulating layer 150 can be formed by a deposition process. In addition, the thickness of the insulating layer 150 disposed at the portion of the oxide layer 149 that is on the bottom of the first opening 142 is thicker than the thickness of the insulating layer 150 disposed on the sidewall of the first opening 142. In addition, the oxide layer 149 can be silicon oxide, and the insulating layer 150 can be silicon nitride.

Figure 14:
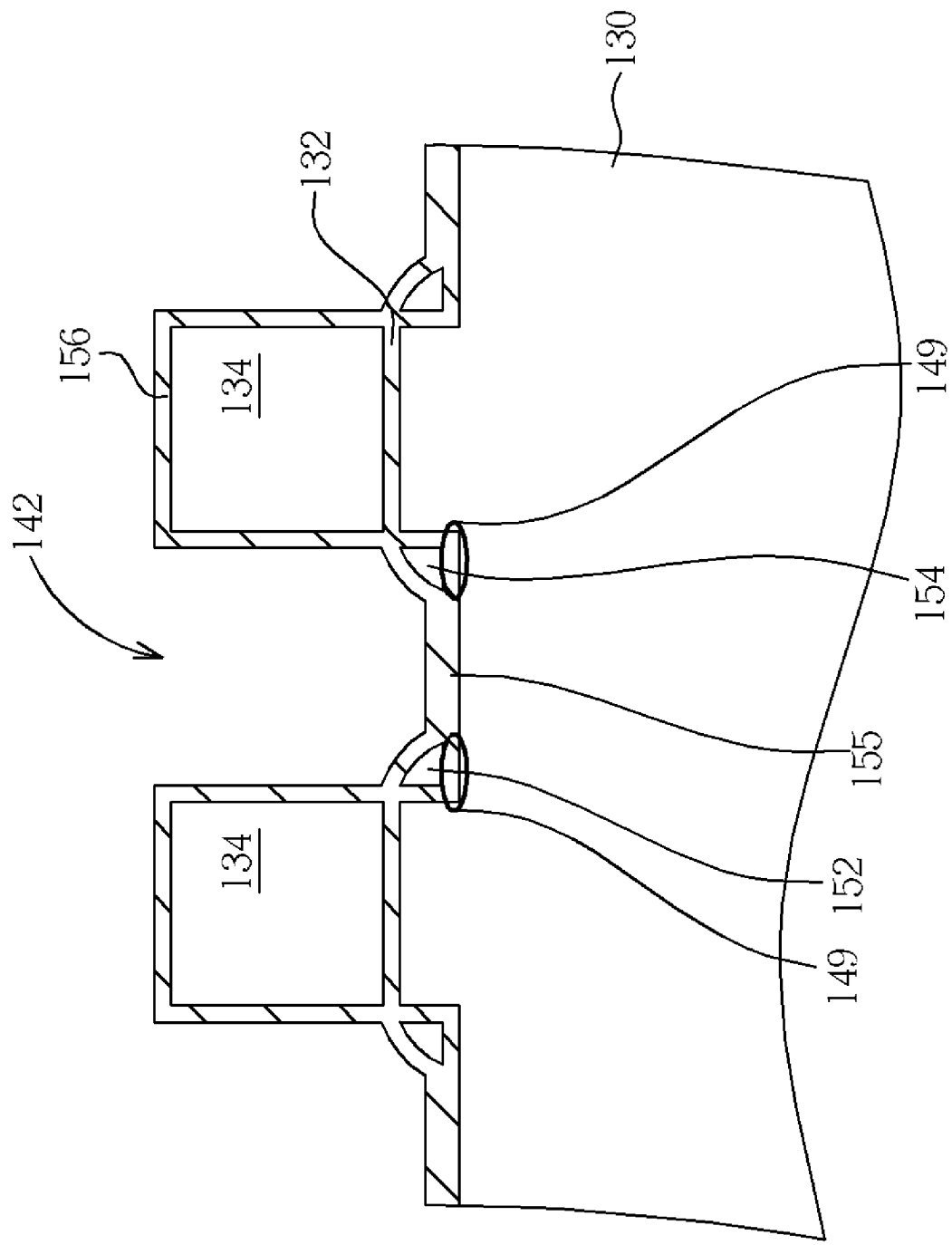

As shown in FIG. 14, the insulating layer 150 is etched to form two insulating materials 152, 154 at the bottom on bottom corners of the first opening 142. The insulating materials 152, 154 serve as independent charge storage regions and the insulating materials 152, 154 do not connect with each other. It is one of the features of the present invention that the insulating materials 152, 154 can be formed through an etching process by using the difference in thickness mentioned above. Furthermore, the insulating materials 152, 154 are disconnected with each other. According to a preferred embodiment, the surface of the insulating materials 152, 154 are spherical, but they are not limited to this shape. In addition, the difficulty in self-alignment can be decreased by using the method of forming the insulating materials 152, 154 mentioned above. Furthermore, when the insulating layer 150 is etched to form the insulating materials 152, 154, a portion of the oxide layer 149 which is not covered by the insulating layer 150 is etched as well. The portion of the oxide layer 149 that is etched becomes thinner, and cannot make the substrate 130 isolate to the control gate which will be formed afterwards.

Therefore, an oxide layer 155 is formed on the portion of the oxide layer 149 that is not covered by the insulating materials 152, 154. The oxide layer 155 can be formed by a rapid thermal oxidation process. In addition, the portion of the oxide layer 149 that is covered by the insulating materials 152, 154 serves as a tunnel oxide layer. The portion of the oxide layer 149 that is covered by the oxide layer 155, and the oxide layer 155 serves as a control gate oxide layer.

Then, a dielectric layer 156 such as silicon oxide is formed on the surface of the insulating materials 152, 154 and the surface of the oxide layer 155. The dielectric layer 156 may be a high temperature oxide (HTO). The tunnel oxide layer, the insulating materials 152, 154 and the insulating layer 156 combine to form an oxide-nitride-oxide (ONO) composite layer.

Figure 15:
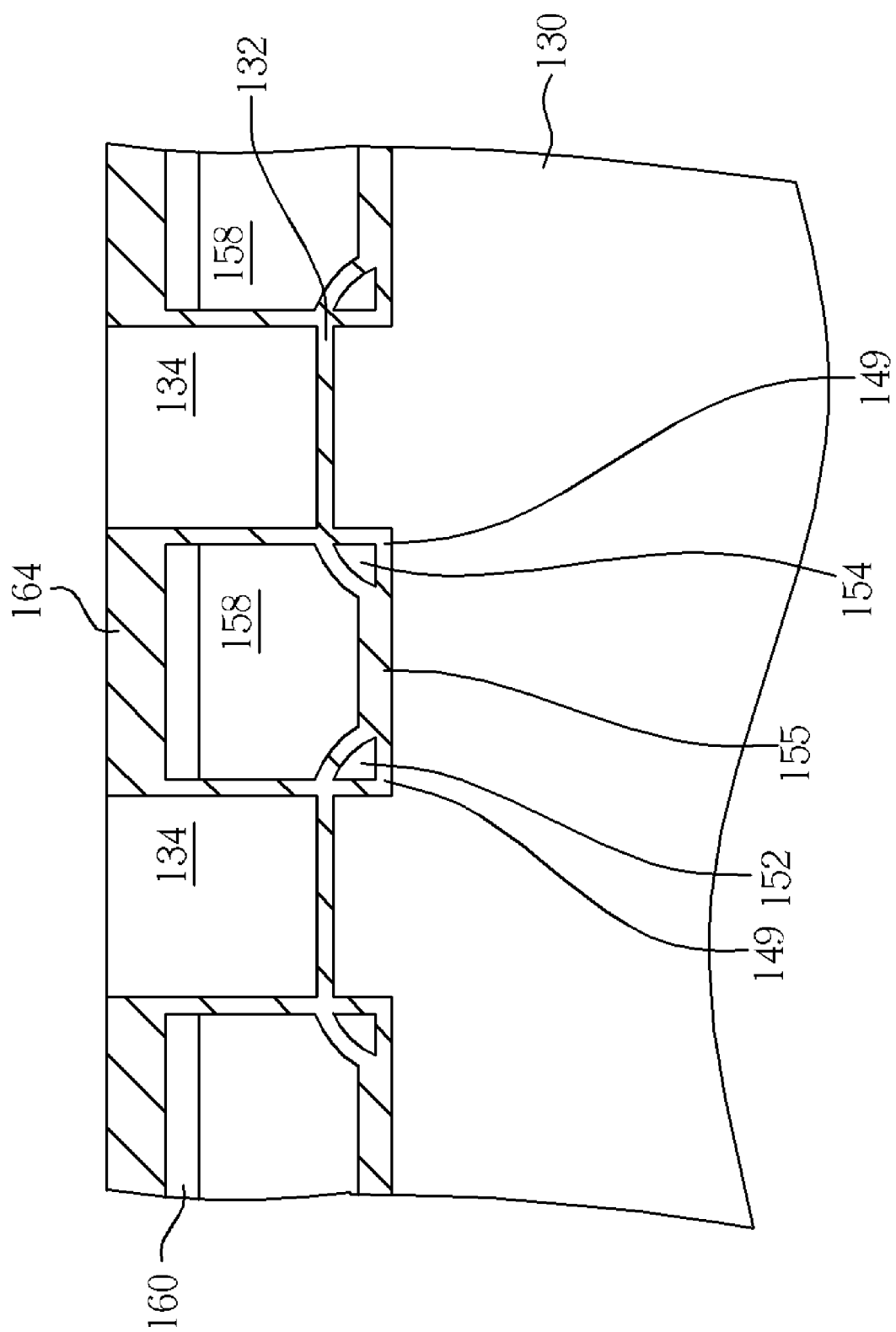

As shown in FIG. 15, the first opening 142 is filled up with a conductive layer 158 such as polysilicon to form a conductive gate. The conductive gate may serve as a control gate. According to different requirements, a salicide layer 160 can be optionally formed on the conductive layer 158. After that, a silicon oxide layer 164 can be formed on the salicide layer 160.

Figure 16:
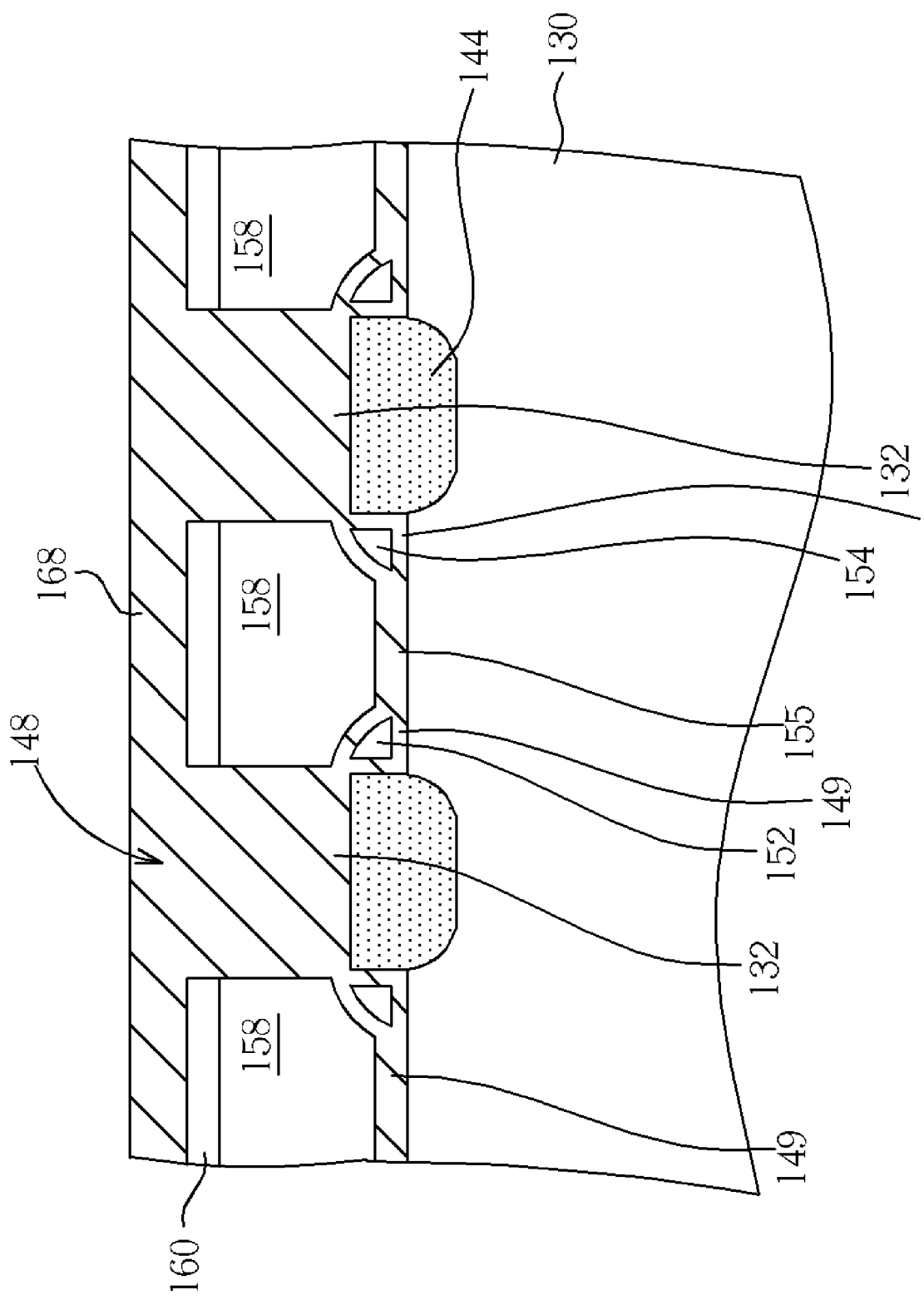

As shown in FIG. 16, the silicon nitride 134 is removed to form a second opening 148. Next, a source/drain doping region 144 is formed at the bottom of the second opening 148 by an ion implantation process. At this point, a memory cell according to another preferred embodiment of the present invention is finished.

Then, the second opening 148 is filled up with a dielectric layer 168 such as silicon oxide, and the dielectric layer 168 covers the salicide layer 160 and the silicon oxide layer 132.

The method of fabricating the memory cell of the present invention means that two independent storage regions embedded into two opposite sidewalls of the control gate can be formed respectively. In this way, storage of two-bit data can be more reliable, and the fabricating process can be simplified as well.

Those skilled in the art will readily observe that numerous modifications and alterations of the device and method may be made while retaining the teachings of the invention.

What is claimed is:

1. A method of fabricating a memory cell comprising:
   forming a doping region in a substrate;
   providing a patterned first dielectric layer on the substrate to expose a substrate surface;
   forming a second dielectric layer on top of the substrate surface wherein the bottom of the second dielectric entirely contacts the top of the first dielectric and the two dielectrics are different materials, wherein the second dielectric layer contacts the patterned first dielectric layer;
   forming two insulating materials at junctions between the second dielectric layer and the patterned first dielectric layer;
   conformally forming a third dielectric layer to cover the patterned first dielectric layer, the second dielectric layer and the two insulating materials; and
   forming a conductive material on top of the third dielectric layer.

2. The method as claimed in claim 1, wherein the two insulating materials forming step comprises:
   conformally forming an insulating layer on the patterned first dielectric layer and the second dielectric layer; and
   partially removing the insulating layer so that the two insulating materials are formed at the junctions between the second dielectric layer and the patterned first dielectric layer.

3. The method of fabricating a memory cell according to claim 2, wherein after the conductive material forming step further comprises:
   forming a salicide layer on top of the conductive layer;
   forming a silicon nitride layer on top of the salicide layer; and
   forming a silicon oxide layer on top of the silicon nitride layer.

4. The method of fabricating a memory cell according to claim 3, wherein the two insulating materials comprises silicon nitride.

5. The method of fabricating a memory cell according to claim 4, wherein the second dielectric layer, the insulating materials, and the third dielectric layer comprises a combination of nitride-oxide-nitride.

6. The method of fabricating a memory cell according to claim 1, wherein the patterned first dielectric layer is disposed directly on and contacts the doping region.

7. The method of fabricating a memory cell according to claim 1, wherein the conductive material overlaps the third dielectric layer entirely.

* * * * *